United States Patent
Yokota

(10) Patent No.: US 8,369,374 B2
(45) Date of Patent: Feb. 5, 2013

(54) LIGHT SOURCE DEVICE

(75) Inventor: Toshio Yokota, Gotenba (JP)

(73) Assignees: Ushio Denki Kabushiki Kaisha, Tokyo (JP); Energetiq Technology, Inc., Woburn, MA (US)

( * ) Notice: Subject to any disclaimer, the term of this patent is extended or adjusted under 35 U.S.C. 154(b) by 0 days.

(21) Appl. No.: 12/844,028

(22) Filed: Jul. 27, 2010

(65) Prior Publication Data

US 2011/0026547 A1 Feb. 3, 2011

(30) Foreign Application Priority Data

Jul. 30, 2009 (JP) .................................. 2009-177569

(51) Int. Cl.
*H01S 3/09* (2006.01)
(52) U.S. Cl. ................ 372/69; 372/18; 372/55; 372/70; 372/71
(58) Field of Classification Search .................... 372/18, 372/69, 70, 71, 55
See application file for complete search history.

(56) References Cited

U.S. PATENT DOCUMENTS

| 5,412,674 A | * | 5/1995 | Scheps ............................ 372/22 |
| 5,867,305 A | * | 2/1999 | Waarts et al. ............ 359/337.12 |
| 7,435,982 B2 | | 10/2008 | Smith |
| 2006/0146901 A1 | * | 7/2006 | Budni ............................ 372/39 |
| 2006/0153254 A1 | * | 7/2006 | Franjic et al. ..................... 372/30 |

FOREIGN PATENT DOCUMENTS

JP 61-193358 A 8/1986

* cited by examiner

*Primary Examiner* — Yuanda Zhang
(74) *Attorney, Agent, or Firm* — Roberts Mlotkowski Safran & Cole, P.C.; David S. Safran

(57) ABSTRACT

A light source device wherein the high-temperature plasma state after the start of the lighting is maintained stably and the light emission can be maintained stably and a decrease of the lighting life cycle by means of a heating of the light emission tube is suppressed comprises a light emission tube, in which a light emitting means is enclosed, and a pulsed laser oscillator part emitting a pulsed laser beam towards said light emission tube, wherein a continuous-wave laser oscillator part is provided emitting a continuous-wave laser beam towards said light emission tube.

8 Claims, 14 Drawing Sheets

Fig. 17(a)
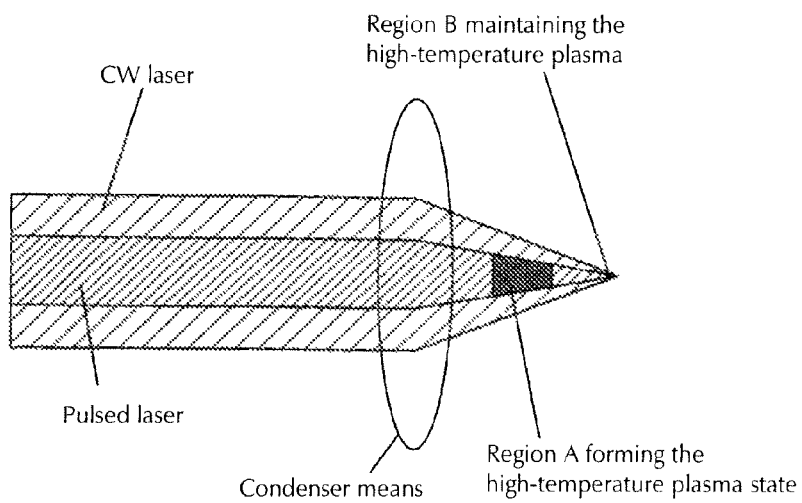
Fig. 17(b)
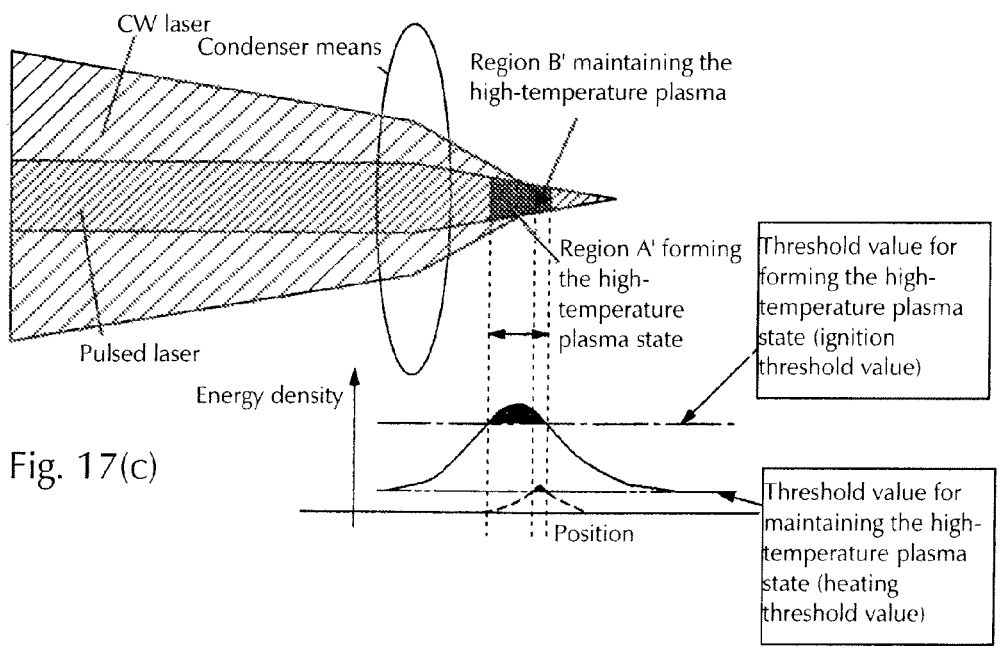
Fig. 17(c)

LIGHT SOURCE DEVICE

BACKGROUND OF THE INVENTION

1. Field of Invention

The present invention relates to a light source device lighted by means of a laser beam emitted from a laser device, which is ideally suited for use in an exposure device.

2. Description of Related Art

Light source devices which are configured such that a laser beam from a laser device is radiated towards a light emission tube in which a light emitting gas is enclosed, the gas is excited and light is emitted are known (see JP-A-61-193358 (1986)). With the device disclosed in JP-A-61-193358 (1986), a beam from a laser oscillator oscillating continuous or pulsed laser light is focused by a focusing component of an optical system such as a lens and radiated towards a light emission tube in which a light emitting gas (light emitting means) is enclosed. The light emitting gas in the light emission tube is excited and light is emitted. In lines 16 to 18 from the top of the right upper column on page 2 of JP-A-61-193358 (1986) it is stated that said laser oscillator oscillates continuous or pulsed laser light having sufficient intensity for the discharge excitement of the enclosed gas.

As to the laser beam exciting the light emitting gas enclosed in the light emission tube a continuous or pulsed laser beam is contemplated, as is stated in JP-A-61-193358 (1986), but is has been found that the following problems occur irrespective of whichever laser beam is used.

(a) As in the case of a pulsed laser beam the lighting is started by 'oscillating a pulsed laser beam having sufficient intensity for the discharge excitement of the enclosed gas', the laser beam is radiated towards the enclosed gas intermittently, as is shown in FIG. 18(a), because of which the high-temperature plasma state may become interrupted with the interruption of the laser light and it is difficult to maintain the high-temperature plasma state at all times. In other words, there is the problem that the discharge maintenance is instable.

(b) When, in the case of a continuous laser beam, a continuous laser beam having sufficient intensity for the discharge excitement of the enclosed gas is oscillated, the lighting is started, but if the same energy as at the time of the start of the lighting is inputted also when the high-temperature plasma state is maintained, as is shown in FIG. 18(b), the tube sphere is heated, and because of this heat distortions of the tube sphere are generated and breakages occur. In other words, there is the problem that the lighting life cycle is short. Further, the power of the laser light necessary to start the discharge amounts from some ten to some hundred kW, but a laser device continuously outputting laser light with such a high output is large and costly and therefore impractical.

SUMMARY OF THE INVENTION

The present invention was made to solve the above mentioned problems. The object of the present invention is to provide a light source device emitting a laser beam towards a light emission tube in which a light emitting means is enclosed, wherein the high-temperature plasma state after the start of the lighting is maintained stably and the light emission can be maintained stably without emitting a laser beam with a large power, and a decrease of the lighting life cycle by means of a heating of the light emission tube is suppressed.

As the peak power of a pulsed laser beam is large, it is possible to excite the gas enclosed in the light emission tube with the output of a comparatively small laser device. As, on the other hand, a continuous-wave laser beam is not interrupted such as a pulsed laser beam, it is possible to maintain the light emission by emitting a continuous-wave laser beam towards the light emission tube being in the high-temperature plasma state.

Because of these facts the present inventors have tried to light a light emission tube in which a light emitting means is enclosed using both a pulsed laser beam and a continuous-wave laser beam. As a result it was confirmed that it was possible to reliably start the lighting of the light emission tube and to stably maintain the lighting after the start of the lighting by using a laser device with a comparatively small power when the lighting was started by means of emitting the pulsed laser beam towards the light emission tube in which the light emission element was enclosed and the lighting was maintained by means of emitting a continuous-wave laser beam at the same time.

For the maintenance of the light emission it is necessary that a region with a high-energy state formed by the pulsed laser beam and a region with a high-energy state formed by the continuous-wave laser beam are superposing in the light emission tube. If the laser device is arranged such that the light path of the pulsed laser beam and the light path of the continuous-wave laser beam are superposing along the whole region within the light emission tube, it is possible that the regions with a high-energy state formed respectively by the pulsed laser beam and the continuous-wave laser beam are easily and reliably placed on top of each other in the light emission tube. By means of using the continuous-wave laser beam for excitating and generating the pulsed laser beam, it becomes possible with a comparatively simple configuration to generate a pulsed laser beam the light path of which is placed on top of the continuous-wave laser beam.

Basing on these facts, the present invention solves the above mentioned problems as follows:

(1) The light source device is constituted by a light emission tube in which a light emitting means is enclosed, a pulsed laser oscillator part emitting a pulsed laser beam towards said light emission tube, and a continuous-wave laser oscillator part emitting a continuous-wave laser beam towards said light emission tube.

(2) The configuration is such that in the above mentioned point (1) the light path of the beam from the pulsed laser oscillator part and the light path of the beam from the continuous-wave laser oscillator part are superposing at least along the whole region in the light emission tube.

(3) In the above mentioned points (1) and (2) the pulsed laser oscillator part uses a portion of the beam from the continuous-wave laser oscillator part as the excitation light, excites the laser crystal in said pulsed laser oscillator part and emits a pulsed laser beam.

(4) In the above mentioned points (1), (2) and (3) a focusing means is provided on the way of the light paths of the pulsed laser beam and the continuous-wave laser beam and the pulsed laser beam and the continuous-wave laser beam are focused in the light emission tube, and an optical means is provided on the way of at least one of the light paths of said laser beams such that the region with the high-energy state formed by the pulsed laser beam and the region with the high-energy state formed by the continuous-wave laser beam are placed on top of each other.

By means of the present invention, the following results can be obtained.

(1) Because the light source device is constituted by a light emission tube in which a light emitting means is enclosed, a pulsed laser oscillator part emitting a pulsed laser beam towards said light emission tube, and a continuous-wave laser oscillator part emitting a continuous-wave laser beam towards said light emission tube, a high-temperature plasma state is generated by the pulsed laser beam, the high-temperature plasma state can be maintained by the continuous-wave laser beam, interruptions of the high-temperature plasma state can be suppressed and the discharge conditions can be stabilized.

As the luminance of the continuous-wave laser beam with the intensity necessary to maintain the high-temperature plasma state is good and a laser oscillating part with a comparatively small power can be used, the light emission tube is not heated and a long life cycle can be achieved.

Because the pulsed laser beam has a large peak power, it becomes possible to generate a high-temperature plasma state with a laser device having a comparatively small average output, and because it is possible to use an oscillating part with a comparatively small output also for the continuous-wave laser oscillating part, the device is not rendered large-scale.

(2) By means of the fact that the light path of the beam from the pulsed laser oscillator part and the light path of the beam from the continuous-wave laser oscillator part are superposing at least along the whole region in the light emission tube, the regions with a high-energy state of the pulsed laser beam and the continuous-wave laser beam can be placed on top of each other in the interior of the light emission tube. Therefore, the formation of the high-temperature plasma state and the maintenance of the high-temperature plasma state can be performed reliably, an interruption of the high-temperature plasma state is suppressed and a stable discharge becomes possible.

(3) By means of the fact that the pulsed laser oscillator part uses a portion of the beam from the continuous-wave laser oscillator part as the excitation light, excites the laser crystal in said pulsed laser oscillator part and emits a pulsed laser beam, the configuration of the device can be simplified.

Further, it is possible to reliably place the light paths of the pulsed laser beam and the continuous-wave laser beam on top of each other and to reliably perform the formation of the high-temperature plasma state and the maintenance of the high-temperature plasma state.

(4) By means of the provision of a focusing means on the way of the light paths of the pulsed laser beam and the continuous-wave laser beam and the condensation of the pulsed laser beam and the continuous-wave laser beam in the light emission tube, and the provision of an optical means on at least one light path of said laser beams, the region with a high-energy state formed by the pulsed laser beam and the region with a high-energy state formed by the continuous-wave laser beam can be placed on top of each other reliably.

Further, by means of the provision of said optical means, even in case of differing wavelengths of the pulsed laser beam and the continuous-wave laser beam the chromatic aberration because of this difference can be corrected and the region with a high-energy state formed by the pulsed laser beam and the region with a high-energy state formed by the continuous-wave laser beam can be placed on top of each other reliably.

BRIEF DESCRIPTION OF THE DRAWINGS

The invention is further described below using several embodiments shown in the drawings.

FIG. 17 is a schematical view explaining the case of forming a high-temperature plasma state by the pulsed beam ahead of the focusing point.

DETAILED DESCRIPTION OF THE INVENTION

Figure 1:
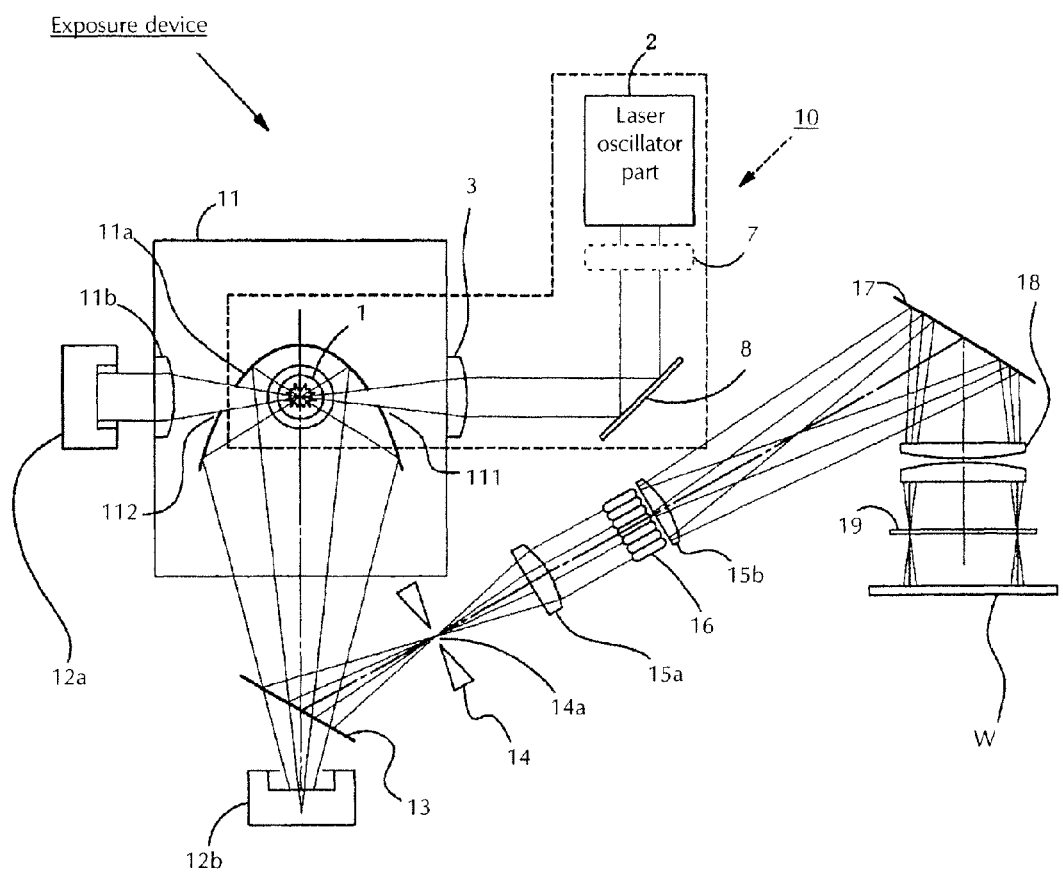
FIG. 1 is a schematical view showing a configurational example for the application of the light source device of the present invention in an exposure device.
Figure 2:
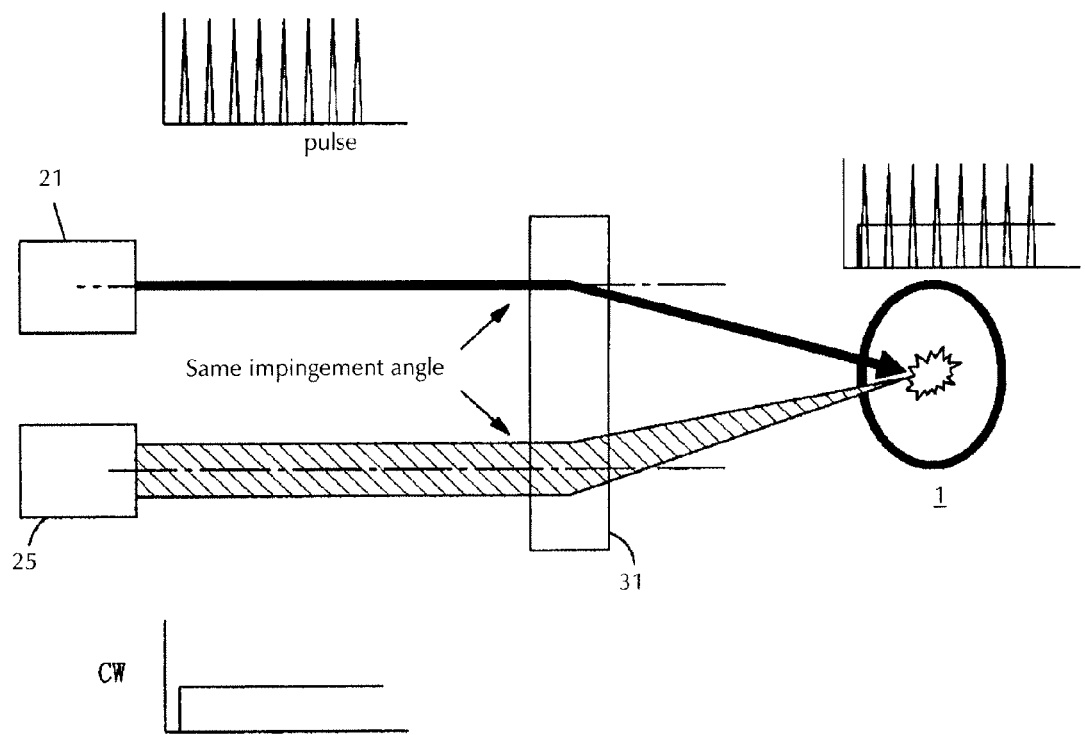
FIG. 2 is a schematical view showing a first embodiment of the light source device according to the present invention.

FIG. 1 is a view showing a configuration in which the light source device according to the present invention is used in an exposure device being one example for the use of the light source device. FIG. 2 is a view showing a first embodiment of the light source device according to the present invention. First, the exposure device provided with the light source device of the present invention is explained by means of FIG. 1.

The exposure device is provided with a light source device 10 emitting light. As this light source device 10 is explained in detail using FIG. 2, it is only briefly explained here. The light source device 10 comprises a laser oscillator part 2, a focusing means 3 focusing the light from said laser oscillator part 2, and a light emission tube 1 irradiated with the light focused by said focusing means 3. In FIG. 1 only one laser oscillator part 2 is shown, but as mentioned below this laser oscillator part 2 consists of a pulsed laser oscillator part outputting a pulsed laser beam and a continuous-wave laser oscillator part outputting a continuous-wave laser beam. A mechanical shutter 7 and a mirror 8 are provided on the light path of the beam from the laser oscillator part 2 to the focusing means 3, and the emission/non-emission of the beam is controlled by the opening and closing of the shutter 7.

The light emission tube 1 is surrounded roughly by a mirror 11a having an ellipsoid of revolution-shaped reflection surface. The mirror 11a has a throughhole 111 into which the light from the laser oscillator part 2 radiates and another throughhole 112 emitting light having passed through the light emission tube 1. The mirror 11a and the light emission tube 1 are accommodated in a lamp housing 11. At the lamp housing 11a focusing means 3 constituting the light source device 10 is provided. Further, at the lamp housing 11 also a focusing means 11b focusing light which has been emitted from the other throughhole 112 of the condenser mirror 11a is provided. At the outside of the lamp housing 11a beam damper 12a is arranged, into which the light from the focusing means 11b radiates and which damps the incident light and makes sure that it does not return into the lamp housing.

The beam from the laser oscillator part 2 enters into the light emission tube 1, the light emitting gas in the interior of the light emission tube is excited and excitation light is generated. This excitation light is focused by the mirror 11a, is emitted towards the bottom side of the paper surface in FIG. 1, and reaches a dichroic mirror 13. The dichroic mirror 13 reflects light with the wavelength necessary for the exposure and lets the remaining light pass. At the back side of the dichroic mirror 13 a beam damper 12b is arranged, and the light having passed through the dichroic mirror 13 is gathered there and terminates.

The light having been reflected by the dichroic mirror 13 is focused by the condensation from the mirror 11a and passes through the aperture part 14a of a filter 14 arranged at the focal position. This time, the light is shaped according to the shape of the aperture part 14a. The light having passed through the aperture part 14a is focused, while expanding, by a focusing means 15a which is arranged on its way of progression and becomes approximately parallel light. This light enters into an integrator lens 16 and is focused by a focusing means 15b which is arranged at the emission side. By being focused by the focusing means 15b, the light radiating from each cell lens of the integrator lens 16 is piled up within a small distance with the intention to provide uniformness of the irradiance. While being piled up, the light having been emitted from the focusing means 15b is reflected by a mirror 17 and enters into a collimator lens 18. The light being emitted from the collimator lens 18 has been made parallel light, passes through a mask 19 and irradiates an object W to be irradiated such as a silicon wafer. Thus, the light from the light source device performs an irradiation treatment of the object W to be irradiated.

Next, the light source device according to a first embodiment of the present invention is explained using FIG. 2. In the first to fourth embodiments explained below, cases are shown in which the light path of the beam from the continuous-wave laser oscillator part 25 and the light path of the beam from the pulsed laser oscillator part 21 are different but are finally placed on top of each other and focused in the interior of the light emission tube 1.

The light source device shown in FIG. 2 being the first embodiment of the present invention comprises a light emission tube 1 in the interior of which a light emitting gas is enclosed, a diffraction optical element (DOE) 31 focusing in the interior of the light emission tube 1, a pulsed laser oscillator part 21 radiating a pulsed beam into the diffraction optical element 31, and a continuous-wave laser oscillator part 25 radiating a continuous-wave beam into the diffraction optical element 31. In this embodiment, the wavelengths of the laser beams from each laser oscillator part 21, 25 are equal. In the following, the continuous-wave beam will also be referred to as CW beam, and the continuous-wave laser oscillator part will also be referred to as CW laser oscillator part. The pulsed beam will also be referred to as pulsed beam.

The light emission tube 1 is constituted from a material through which the beams from the laser oscillator parts 21, 25 pass and through which the excitation light of the light emitting means passes (for example quartz glass). The light emission tube 1 can be of any shape which can enclose the light emitting means. But if the light emitting means is enclosed with a high pressure (a pressure larger than the atmospheric pressure), it is preferable with regard to the durability that the shape of the inner surface being an ellipsoid-of-revolution face or a spherical face so that the pressure acts almost uniformly onto the inner face of the light emission tube 1.

The light emitting means is enclosed in the interior of the light emission tube 1, but according to the use various light emitting means can be employed. For a light source for exposure light, mercury is used as the light emitting means. Further, for a light source for a projector, for example, xenon gas is used as the light emitting means.

Figure 3A:
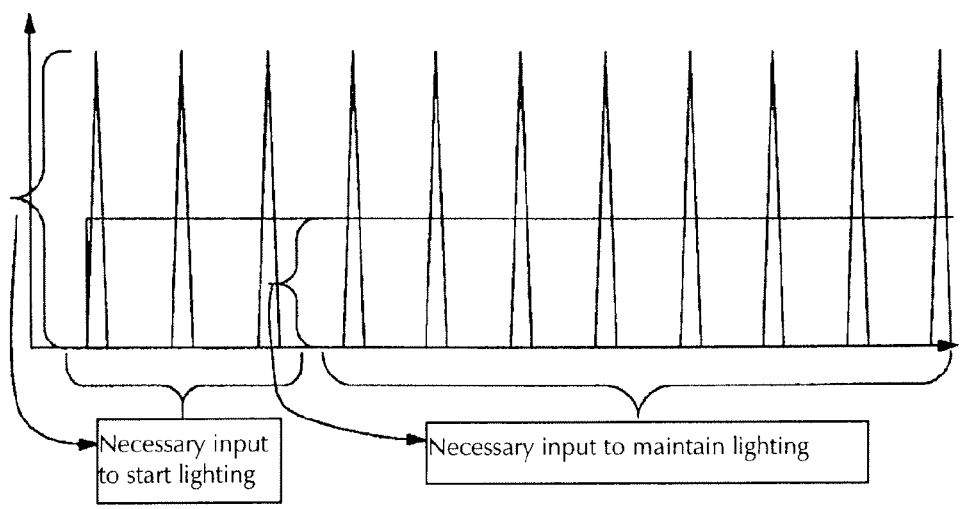
FIG. 3 is a schematical view showing the pulsed beam and the continuous-wave beam in the interior of the light emission tube.

Each laser oscillator part 21, 25 is powered by a power source not shown. From the pulsed laser oscillator part 21 a pulsed beam is emitted while from the continuous-wave laser oscillator part 25 a continuous-wave beam is emitted. As both are radiated with the same angle (in the case of the drawing in parallel) towards the diffractive optical element (DOE) 31, they are placed on top of each other and focused in the interior of the light emission tube 1 after passing through the DOE. At this time, the pulsed beam and the continuous-wave beam are superposing in the interior of the light emission tube 1, as is shown in FIG. 3(a).

The light emitting means enclosed in the interior of the light emission tube 1 needs a large energy amount to form the high-temperature plasma state. Because the pulsed beam, although being intermittent, can form high energy, supposingly by means of this beam the light emitting means is brought into the high-temperature plasma state. After the formation of the high-temperature plasma state the energy which is necessary to maintain this state can be smaller than at the time of the formation of the high-temperature plasma state, but a continuous supply is necessary. Because the continuous beam is superposing in the interior of the light emission tube 1 at the position the pulsed beam has entered, has less energy as compared to the pulsed beam (the longitudinal axis in FIG. 3(a) shows the relative values of the energy) and is continuous, it can maintain the high-temperature plasma state. Thus, the pulsed laser oscillator part 21 is used as the source of ignition starting the high-temperature plasma state while the continuous-wave laser oscillator part 25 functions as a heating source heating the high-temperature plasma state.

The light source device of the present invention as above has the following characteristics (1) and (2).
(1) The pulsed laser beam and the continuous-wave laser beam are superposing in the interior of the light emission tube 1.
(2) The intensity (energy) of the continuous-wave laser beam is smaller than that of the pulsed laser beam.

Thus, at the time the lighting is started the formation of the high-temperature plasma state is possible by means of the pulsed beam. Further, by superimposing the continuous-wave beam having a smaller intensity than the pulsed beam at the position at which the high-temperature plasma state has been formed, an interruption of the high-temperature plasma state is suppressed and the high-temperature plasma state can be maintained reliably. Furthermore, as the intensity of the continuous-wave beam is smaller than that of the pulsed beam, also the energy inputted into the interior of the light emission tube is not large and a heating of the light emission tube and the generation of distortions can be suppressed, and by means of this the lighting life cycle can be prolonged. Further, as it is not necessary for the continuous-wave laser oscillator part to output an energy being large enough to form a high-temperature plasma state, it can be implemented employing a presently practically utilized laser device. The high-temperature plasma state becomes easy to form by forming a region of energy with a high density. To do so it is preferable to condense such that the focal point lies in the interior of the light emission tube.

To confirm that the energy of the continuous-wave laser beam can be smaller than that of the pulsed beam, a light emission tube (quartz glass) in which xenon was enclosed with 10 atm was prepared, a pulsed laser beam (527 nm) and a continuous-wave laser beam (1070 nm) were focused by an optical means (convex lens) and superimposed in the interior of the light emission tube, and the light emission of the light emission tube was examined. As a result it was confirmed that the light emission tube emitted light continuously for example under the following input conditions.

Exemplary Input Conditions for the Pulsed Laser Beam
Repetition frequency: 1000 Hz;
Energy: 5 mJoule/shot;
Pulse width: 80 ns;
Average power: 5 W;
Peak power: 62.5 kW.
Exemplary Input Conditions for the Continuous-Wave Laser Beam
Power: 200 W In the above mentioned example the power of the continuous-wave laser beam amounted to approximately 0.03% of the power of the pulsed laser beam. Thus, although the power of the continuous-wave laser beam was by far smaller than the power of the pulsed laser beam, it was possible to light the light emission tube.

The reasons why the power of the continuous-wave laser beam can be smaller than the power of the pulsed laser beam are thought to be as follows. In the light emission tube, at the time the lighting is started a high-temperature plasma state is formed by emitting a high energy into the light emission tube. By means of inputting energy from the outside into the once-formed high-temperature plasma the high-temperature plasma is excited and light is emitted. But when a pulsed beam with a high energy is emitted from the outside, the high-temperature plasma state is dispersed by the shock waves at the time the plasma is formed by the pulsed laser, and it becomes impossible to input energy into the high-temperature plasma state and to excite it. Now, the energy being necessary at the time the lighting is started is energy to form the high-temperature plasma state, but the energy being necessary after the lighting has been started is energy to excite the high-temperature plasma state, and when comparing the energies which are at least necessary, the energy to excite the high-temperature plasma state may be by far lower. Therefore, an extremely low energy amounting to 0.03% as compared to the power of the pulsed beam is sufficient for the power of the continuous-wave beam to excite the high-temperature plasma state. As the known problems of a heating and a breakage of the wall of the light emission tube arise when a higher power than necessary is inputted, it is necessary that the power of the continuous-wave beam has a low energy such as 0.03%.

Figure 3B:
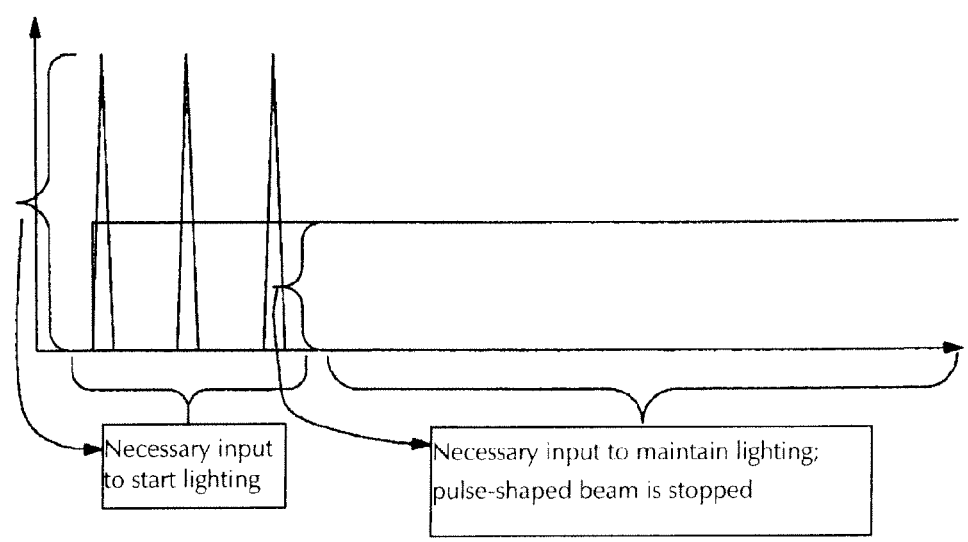

At the time the lighting is started a pulsed beam is implicitly necessary, as was described above, but when the energy of a continuous beam is sufficient to maintain the lighting, the purposely continuously lighting high-temperature plasma is interrupted by the shock waves from the pulsed beam if the pulses are continued for a long time. Therefore it is thought to be advantageous to eliminate the input of the pulsed beam after the lighting has been started, as is shown in FIG. 3(b). Because, as was explained above, with the light source device of the present invention the high-temperature plasma state can be maintained and the lighting life cycle is long, it becomes possible, for example, to irradiate objects to be irradiated continuously and for a long time with an exposure device shown in FIG. 1 which is provided with this light source device.

The light source device according to the present invention can be used for purposes such as the light source of the exposure device shown in FIG. 1. When the light emitting means in the light emission tube is changed, the output light from the light emission tube can be changed to various wavelengths, and the device can also be used, for example, as the light source for a projector being a light source for visible light. Hitherto known light sources referred to as so-called lamps wherein a pair of electrodes is arranged opposite to each other in the interior of the light emission tube are used for various purposes, but the light source device according to the present invention can be used as a substitution means for such lamps and can be used for the same purposes as these lamps.

In the following, examples for numerical values and materials for the above mentioned first embodiment are presented.
Material of the light emission tube: quartz glass;
Outer diameter of the light emission tube: 30 mm;
Inner diameter of the light emission tube: 26 mm;
Light emitting means enclosed in the light emission tube: xenon;
Enclosure pressure or enclosed amount of xenon: 10 atm;
Laser crystal of the pulsed laser oscillator part: YAG crystal;
Laser crystal of the continuous-wave laser oscillator part: YAG crystal.
Conditions of input energy to the pulsed laser oscillator part:
Wavelength of beam from the pulsed laser oscillator part: 1064 nm;
Wavelength of beam from the continuous-wave laser oscillator part: 1064 nm;
Output of beam from the pulsed laser oscillator part: 1 to 100 mJ;
Pulse repetition frequency: 0.01 to 10 kHz
Output of beam from the continuous-wave laser oscillator part: 20 W-10 kW.

Figure 4:
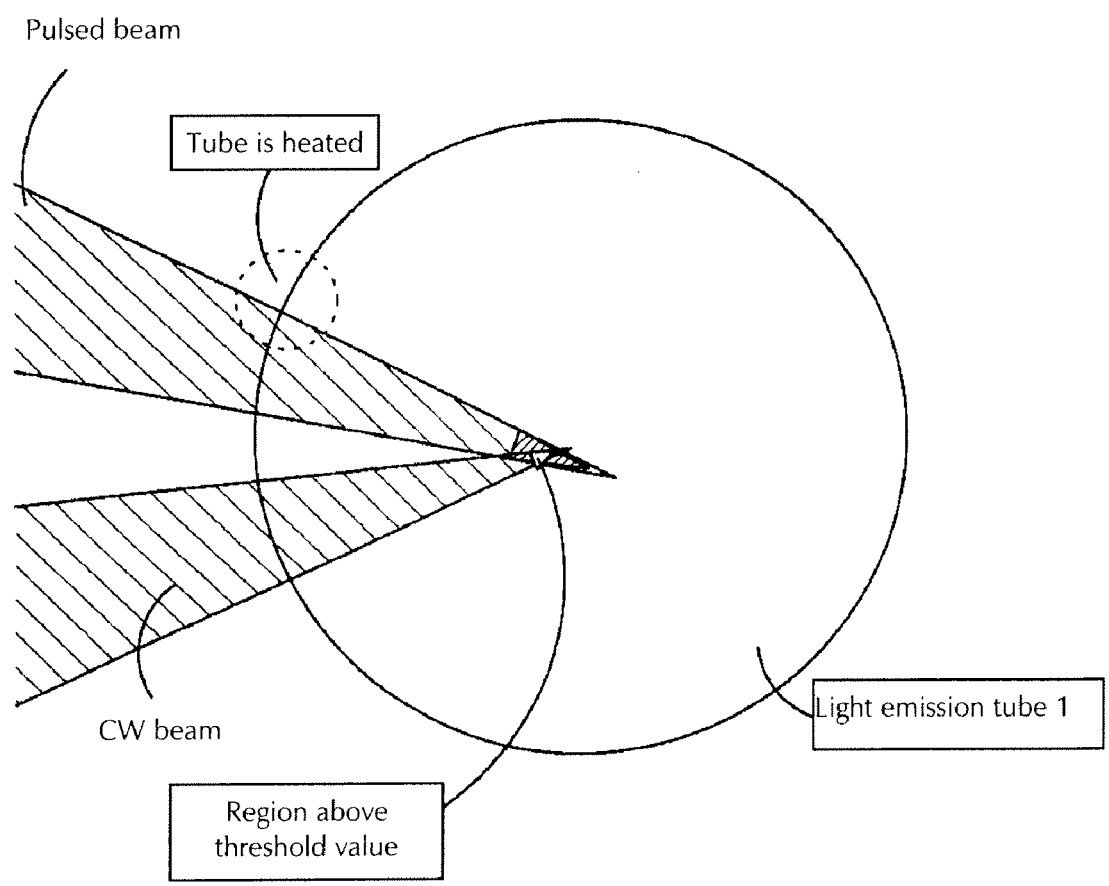
FIG. 4 is a schematical view explaining the states of the continuous-wave beam and the pulsed beam in the interior of the light emission tube.

In the present invention the pulsed beam and the continuous beam are superposing in the interior of the light emission tube. The high-temperature plasma state generated in the interior of the light emission tube by the pulsed beam is generated by means of the energy density of the beam having at least the threshold value ionizing the light emitting means and the ionized light emitting means having a high density. To this end the beam is focused by means of the optical components for focusing and the energy density of the beam is increased and is brought to at least the threshold value ionizing the light emitting means. As at this time, the energy density of the pulsed beam is higher than the energy density of the continuous beam, the region with at least the threshold value (the region with a high-energy state) becomes longer and larger as compared with the continuous beam. Therefore, it is desirable that the continuous-wave laser beam (CW beam) is radiated towards the vicinity of the center of the region with at least the threshold value which region has become long because of the pulsed beam, as is shown in FIG. 4, and by means of this the maintenance of the high-temperature plasma state is performed well and the lighting characteristics can be rendered good.

Figure 5:
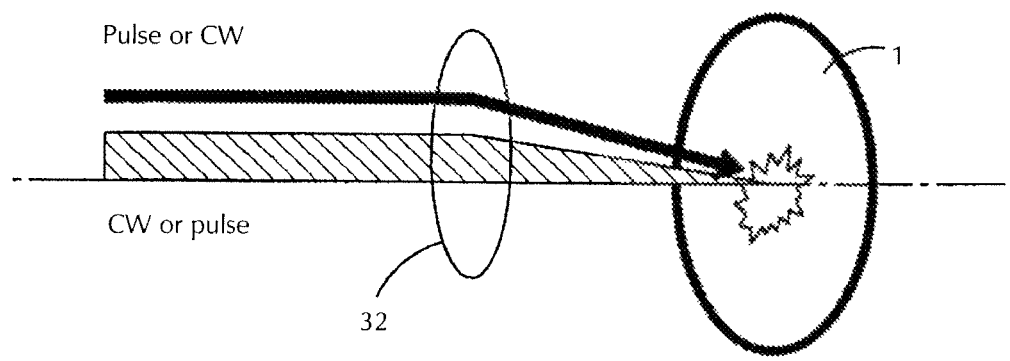
FIG. 5 is a schematical view showing a second embodiment of the light source device according to the present invention.

Next, using FIG. 5, a second embodiment of the present invention will be explained. The light source device shown in FIG. 5 uses a convex lens instead of the DOE 31 shown in FIG. 2 and consists of a light emission tube 1 in the interior of which a light emitting gas is enclosed and a convex lens 32 which is arranged such that the pulsed beam and the continuous-wave beam are focused in the interior of the light emission tube 1. In FIG. 5, the beams shown as 'CW or pulsed' and 'pulsed or CW' mean either one of a continuous-wave laser beam and a pulsed laser beam, and if one beam is a continuous-wave laser beam, the other one is a pulsed laser beam (the same applies to the embodiments below). For the optical means focusing in the interior of the light emission tube also a convex lens 32 as mentioned above can be used, and in this case each beam enters the convex lens 32 with the same angle.

Similar to the light source device of the first embodiment, also in the present embodiment the high-temperature plasma state can be maintained stably, and as the continuous-wave beam has a smaller intensity than the pulsed beam, a heating of the light emission tube and the generation of distortions can be suppressed. By means of this, the lighting life cycle can be prolonged. Further, the continuous-wave laser oscillator part can be implemented employing a presently practically utilized laser device.

Figure 6:
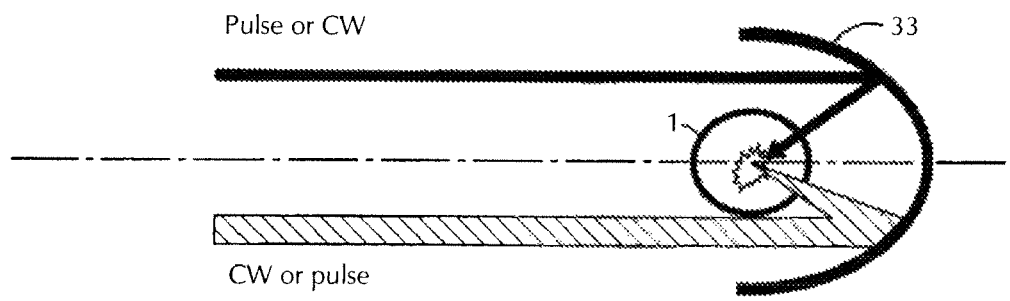
FIG. 6 is a schematical view showing a third embodiment of the light source device according to the present invention.

Using FIG. 6, a third embodiment of the present invention will be explained. In the device shown in FIG. 6, instead of the DOE 31 or the convex lens 32 shown in FIG. 2 and in FIG. 5 respectively a parabolic mirror 33 is arranged at a position surrounding the light emission tube 1, which mirror focuses in the interior of the light emission tube 1. In this case, the light path (optical axis) of the pulsed beam from the pulsed laser oscillator part and the light path (optical axis) of the continuous-wave beam from the continuous-wave laser oscillator part are arranged in parallel and are radiated to the reflecting surface of the parabolic mirror 33. At this time, the beams reflected by the reflecting surface are focused such that they are focused towards the interior of the light emission tube. Similar to the light source devices of the above mentioned embodiments, also in the present embodiment the high-temperature plasma state can be maintained stably, and as the continuous-wave beam has a smaller intensity than the pulsed beam, a heating of the light emission tube and the generation of distortions can be suppressed. By means of this, the lighting life cycle can be prolonged. Further, the continuous-wave laser oscillator part can be implemented employing a presently practically utilized laser device.

Figure 7:
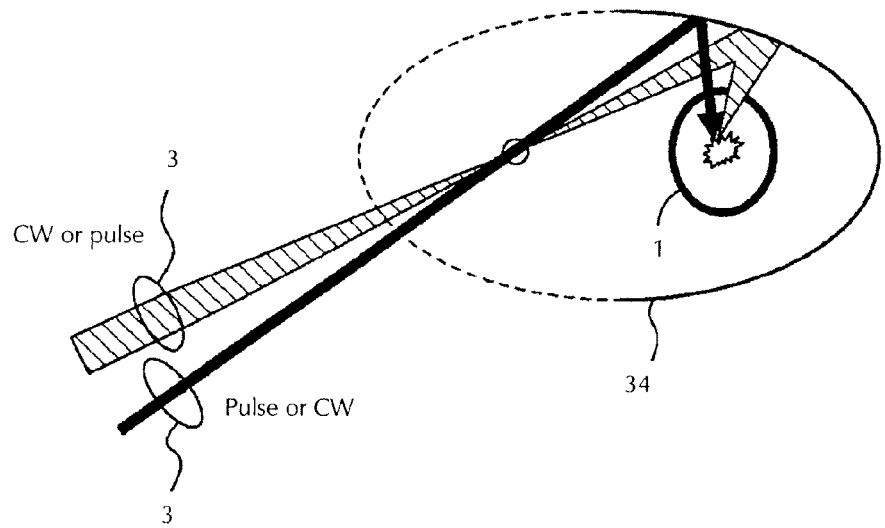
FIG. 7 is a schematical view showing a fourth embodiment of the light source device according to the present invention.

Using FIG. 7, a fourth embodiment of the present invention will be explained. In the device shown in FIG. 7, instead of the parabolic mirror 33 shown in FIG. 6 an elliptical mirror 34 is arranged such that it surrounds the light emission tube 1. This elliptical mirror 34 is arranged such that its first focal point is positioned in the interior of the light emission tube 1 while its second focal point is positioned external of the light emission tube 1. Each laser oscillator part is arranged such that each beam passes through the second focal point. On the light path of each beam, a focusing means 3 (a convex mirror or a DOE) focusing at the second focal point is arranged. Each beam is focused at the second focal point of the elliptical mirror 34 and is reflected at the reflecting surface of the elliptical mirror 34. Because the lights focused at the second focal point are also focused at the first focal point, they are focused such that each beam is focused in the interior of the light emission tube 1. Similar to the light source devices of the above mentioned embodiments, also in the present embodiment the high-temperature plasma state can be maintained stably and the lighting life cycle can be prolonged. Further, the continuous-wave laser oscillator part can be implemented employing a presently practically utilized laser device.

In the above mentioned first to fourth embodiments, each beam follows a different light path, and finally the beams are superposing in the interior of the light emission tube. Such a superposing at a desired position after different light paths have been followed is technically complicated. Although, for example, optical means are arranged and the light paths of the beams are set such that the beams condense at the same position in the light emission tube, the refractive index changes in case of an alteration in the environment such as, for example, a temperature increase, and there is the possibility that the focusing position shifts. The fifth to ninth embodiments explained below refer to devices configured such that the light paths of all beams are superposing at least along the whole region in the light emission tube. By means of such a configuration there is no large shift of the focusing position of the pulsed beam and the continuous-wave beam even if, for example, the temperature increases and the refractive index changes.

Using FIG. 8, the fifth embodiment will be explained.

Figure 8:
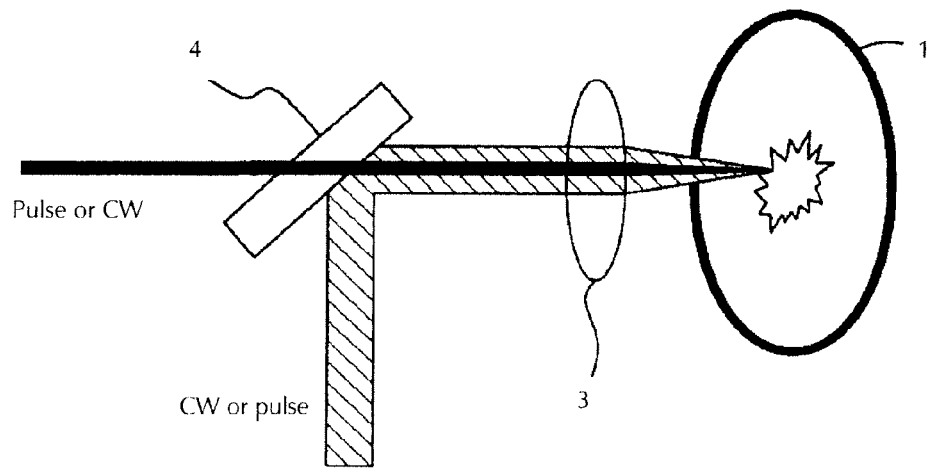
FIG. 8 is a schematical view showing a fifth embodiment of the light source device according to the present invention.

The example shown in FIG. 8 is configured such that the light paths of the pulsed beam and the continuous-wave beam are placed on top of each other using a dichroic mirror 4 and are focused by means of a focusing means 3 (a convex mirror or a DOE). The other configuration is similar to that shown in FIG. 2. In FIG. 8, the wavelengths of the pulsed beam and the continuous-wave beam are different, and therefore one of the beams entering the dichroic mirror 4 is reflected while the other one passes. Using this fact, in the present invention the light paths of the beams are superposing in the region from the dichroic mirror 4 to the light emission tube 1. For example, one beam (shown by a thick line) has a wavelength of 1064 nm while the other beam (shown by solid lines) has a wavelength of 532 nm. As the dichroic mirror 4 reflects light with a wavelength of 532 nm while letting light with a wavelength of 1064 nm pass, the beam with 1064 nm having passed can be placed on top of the light path of the beam with 532 nm having been reflected by the dichroic mirror 4. That means the light paths can be positioned on the same axis.

The high-temperature plasma state is easily formed by forming energy with a high density. Therefore, it is preferred to condense with an optical means 3 (convex lens or DOE) such that the focal point is located in the interior of the light emission tube 1, as is shown in FIG. 8. By means of superposing the light paths of the beams on the way reaching the light emission tube 1, both can be placed on top of each other also in the interior of the light emission tube 1, and thus the regions with a high-energy state of the beams can be reliably placed on top of each other in the interior of the light emission tube 1. Therefore, the formation of the high-temperature plasma state and the maintenance of the high-temperature plasma state can be performed reliably, and a stable discharge becomes possible. As, similar to the light source devices of the above mentioned embodiments, the power of the continuous-wave laser beam can be rendered small, a heating of the light emission tube and the generation of distortions can be suppressed and the lighting life cycle can be prolonged. And the continuous-wave laser oscillator part can be implemented employing a presently practically utilized laser device.

Using FIG. 9, the sixth embodiment will be explained.

Figure 9:
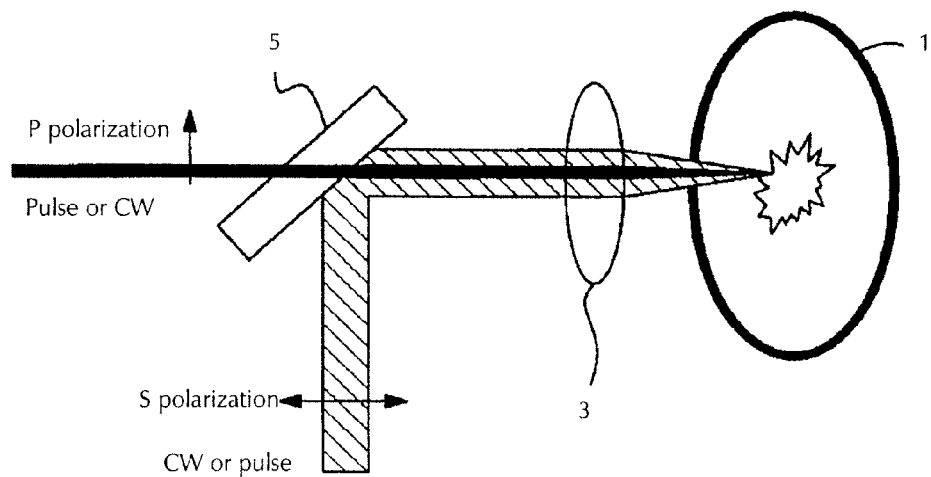
FIG. 9 is a view showing a sixth embodiment of the light source device according to the present invention.

In FIG. 9, instead of the dichroic mirror shown in FIG. 8 a polarizing mirror 5 is arranged. The other configuration is similar to that shown in FIG. 8. The polarizing mirror 5 performs the reflection/passing by means of polarization light (P-polarization and S-polarization) at the same wavelength, and by using this fact the light paths of the beams can be placed on top of each other in the region from the polarizing mirror 5 to the light emission tube. For example, one beam (shown by a thick line) is P-polarization light with a wavelength of 1064 nm while the other beam (shown by solid lines) is S-polarization light also with a wavelength of 1064 nm, and the polarizing mirror 5 is configured such that at a wavelength of 1064 nm P-polarization light can pass while S-polarization light is reflected. Therefore, the beam of the P-polarization light having passed can be placed on top of the light path of the beam of the 5-polarization light having been reflected by the polarizing mirror 5. That is, the light paths can be positioned on the same axis.

By means of superposing the light paths of the beams on the way reaching the light emission tube 1, similar to the fifth embodiment the regions with a high-energy state of the beams can be placed on top of each other reliably in the interior of the light emission tube, and the formation of the high-temperature plasma state and the maintenance of the high-temperature plasma state can be performed reliably. As, similar to the light source devices of the above mentioned embodiments, the power of the continuous-wave laser beam can be rendered small, a heating of the light emission tube and the generation of distortions can be suppressed and the lighting life cycle can be prolonged. And the continuous-wave laser oscillator part can be implemented employing a presently practically utilized laser device.

Next, the seventh to ninth embodiments of the present invention will be explained, wherein a portion of the beam from the continuous-wave laser oscillator part is used as the pilot light of the pulsed laser oscillator part.

Figure 10:
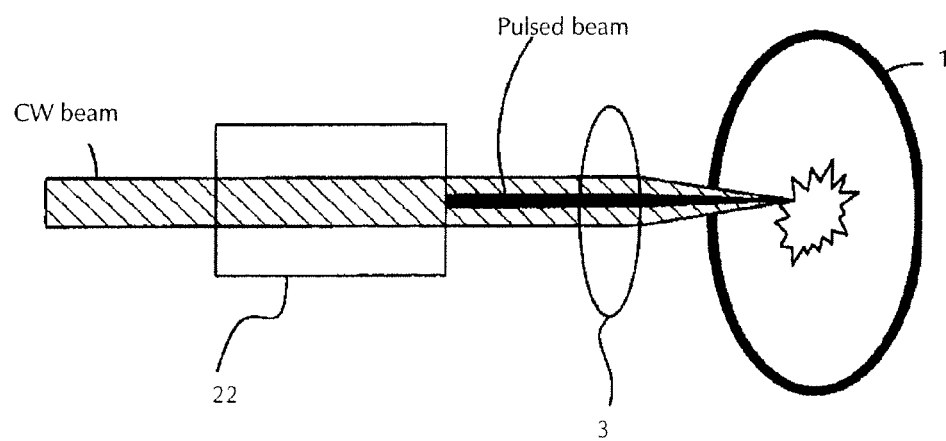
FIG. 10 is a schematical view showing a seventh embodiment of the light source device according to the present invention.

FIG. 10 is a view showing the seventh embodiment of the present invention. In FIG. 10, the pulsed laser oscillator part 22 is arranged on the light path of the beam from the continuous-wave laser oscillator part (not shown). The other configuration is similar to the above mentioned embodiments. In the present embodiment, the pulsed laser oscillator part 22 uses a portion of the continuous-wave beam (CW beam) from the continuous-wave laser oscillator part as the excitation light by means of which the laser crystal in the pulsed laser oscillator part 22 is excited. That means, as shown in FIG. 10, the pulsed laser oscillator part 22 is arranged on the way of the CW beam emitted from the continuous-wave laser oscillator part not shown. The pulsed laser oscillator part 22 employs the CW beam as the excitation light and outputs a pulsed beam. This pulsed beam is placed on top of the light path of the CW beam and focused in the light emission tube 1 via the optical means 3 (convex lens, DOE etc.). By means of this configuration, the light path of the beam from the pulsed laser oscillator part 22 becomes placed on top of the light path of the beam from the continuous-wave laser and is placed on top also in the interior of the light emission tube 1.

As in the present embodiment the light paths of the beams are superimposing on the way reaching the light emission tube 1, the regions with a high-energy state of the beams can be placed on top of each other reliably in the interior of the light emission tube similar to the above mentioned embodiments, and the formation of the high-temperature plasma state and the maintenance of the high-temperature plasma state can be performed reliably. And as, similar to the light source devices of the above mentioned embodiments, the power of the continuous-wave laser beam can be rendered small, a heating of the light emission tube and the generation of distortions can be suppressed and the lighting life cycle can be prolonged. And the continuous-wave laser oscillator part can be implemented employing a presently practically utilized laser device. As, further, the pulsed laser oscillator part 22 uses the beam from the continuous-wave laser as the excitation light, a part of the laser oscillator components for the pulsed laser oscillator part shown in the first to sixth embodiments can be omitted, the structure of the whole device can be simplified and the whole light source device can be downsized.

Figure 11:
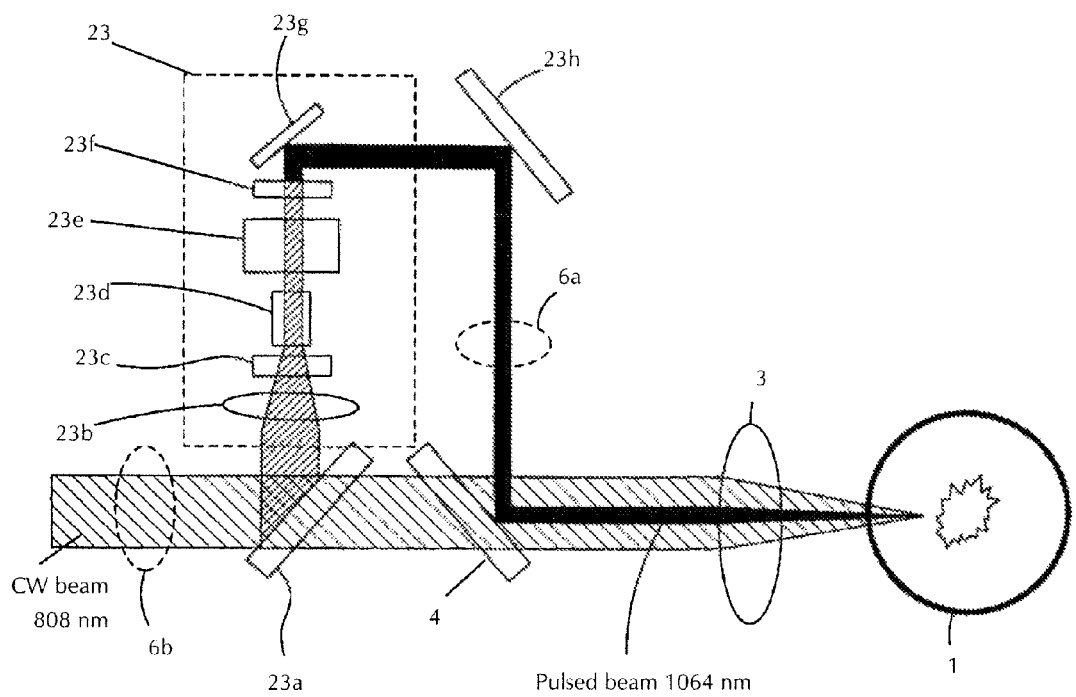
FIG. 11 is a schematical view showing an eighth embodiment of the light source device according to the present invention.

FIG. 11 is a view showing the eighth embodiment of the present invention and presents a configurational example in which similar to the above mentioned seventh embodiment the pulsed laser oscillator part is oscillated using the CW laser as excitation light.

As shown in FIG. 11, a portion of the CW beam emitted from a continuous-wave laser oscillator part not shown is reflected by a partial reflection mirror 23a and radiated to the pulsed laser oscillator part 23. The pulsed laser oscillator part 23 is operated using the CW beam as excitation light and emits a pulsed beam. This pulsed beam is radiated to a dichroic minor 4, placed on top of the light path of the above mentioned CW beam and focused in the interior of the light emission tube 1 via an optical means 3 (convex lens, DOE etc.).

Now, the operation in said pulsed laser oscillator part 23 is explained with 808 nm being the wavelength of the continuous-wave laser beam and 1064 nm being the wavelength of the pulsed laser beam. The partial reflection minor 23a reflects a portion of the beam with a wavelength of 808 nm and lets the remaining light pass. This partially reflected beam is focused by a condenser lens 23b and radiated into a total reflection mirror 23c. The total reflection minor 23c lets the beam impinging from the back face pass while the beam impinging from the front face is reflected. Therefore the beam focused by the condenser lens 23b impinges from the back face side of the total reflection minor 23c and passes and is radiated to a laser crystal 23d. For the laser crystal 23d, for example, a YAG crystal or Nd-glass is used, and the laser crystal is excited by the passing of light with the wavelength of 808 nm. In the state in which a Q-switch 23e is closed the laser crystal 23d is excited by being continuously irradiated with the beam and accumulates energy. When a desired energy has been reached, the Q-switch 23e opens, the excitation light from the laser crystal 23d is reflected by an emission mirror 23f and a resonance is generated between the total reflection mirror 23c and the emission mirror 23f. By means of this, a pulsed laser beam with a wavelength of 1064 nm passes through the emission mirror 23f and is radiated to the dichroic mirror 4 via mirrors 23g, 23h. Because the dichroic mirror 4 reflects the beam with the wavelength of 1064 nm and lets the beam with the wavelength of 808 nm pass, the pulsed laser beam of 1064 nm and the continuous-wave laser beam of 808 nm are placed on top of each other. The beam is focused by the focusing means 3 and directed towards the interior of the light emission tube 1. The pulse width and the period of the pulsed laser beam are determined by the opening time of said Q-switch 23e.

Optical means 6a, 6b shown in FIG. 11 by dotted lines serve to suppress the chromatic aberration occurring because of the different wavelengths of the pulsed beam and the CW beam. The suppression of the chromatic aberration will be explained later.

Also with the present embodiment the same results as those of the seventh embodiment can be obtained and the formation of the high-temperature plasma state and the maintenance of the high-temperature plasma state can be performed reliably. Further, as the power of the continuous-wave laser beam may be small, a heating of the light emission tube and the generation of distortions can be suppressed and the lighting life cycle can be prolonged. Further, the continuous-wave laser oscillator part can be implemented employing a presently practically utilized laser device. And because the pulsed laser oscillator part 23 uses the beam from the continuous-laser oscillator part as the excitation light, the laser oscillator components for the pilot light in the pulsed laser oscillator part shown in the first to sixth embodiments can be omitted, the structure of the whole device can be simplified and the whole light source device can be downsized.

Figure 12:
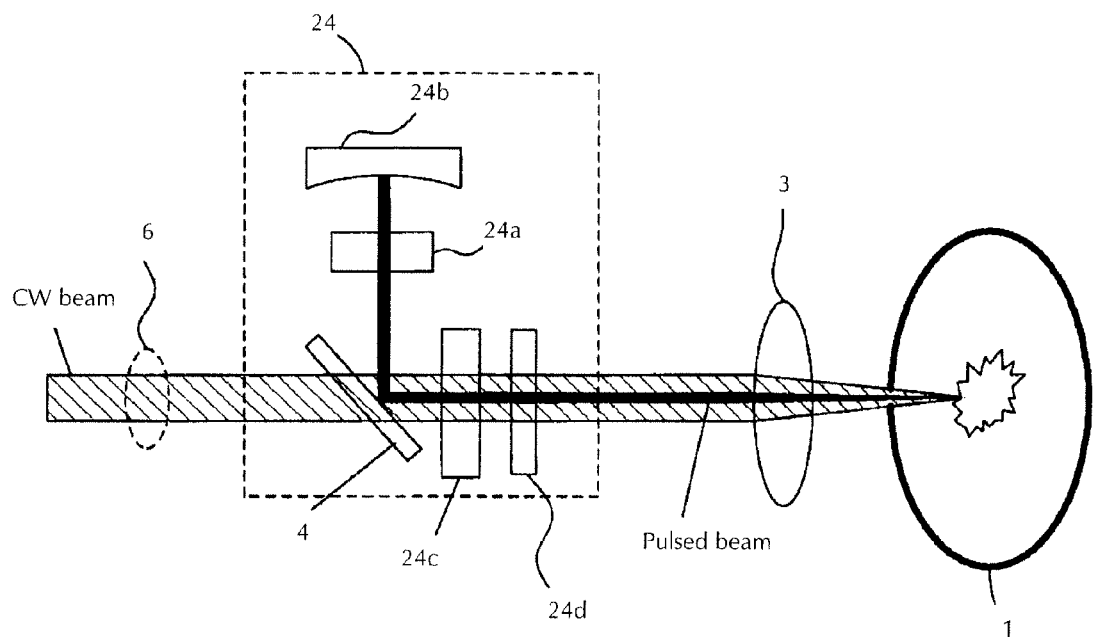
FIG. 12 is a schematical view showing a ninth embodiment of the light source device according to the present invention.

FIG. 12 is a view showing the ninth embodiment of the present invention and presents a configurational example in which similar to the above mentioned seventh embodiment the pulsed laser oscillator part is oscillated using the CW laser as excitation light. As shown in FIG. 12, a portion of a CW beam emitted from a continuous-wave laser oscillator part not shown is reflected by a partial reflection mirror and dichroic mirror 24d and radiated to a pulsed laser oscillator part 24. The pulsed laser oscillator part 24 is operated using the CW beam as excitation light and emits a pulsed beam. This pulsed beam is placed on top of the light path of said CW beam and is focused in the interior of the light emission tube 1 via a focusing means 3 (convex lens, DOE etc.). Here, the operation in said pulsed laser oscillator part 24 is explained with 808 nm being the wavelength of the beam of the continuous-wave laser and 1064 nm being the wavelength of the beam of the pulsed laser.

As mentioned above, the dichroic mirror 4 reflects a certain wavelength while letting another wavelength pass. Here, the beam with the wavelength of 1064 nm is reflected while the beam with the wavelength of 808 nm passes. A partial reflection mirror and dichroic mirror 24d provided at the output side of the pulsed laser oscillator part 24 reflects a portion of a certain wavelength while letting the other wavelength pass. Here, a portion of the beam with 1064 nm is reflected while light with 808 nm passes. For the laser crystal 24c, for example, a YAG crystal or Nd-glass is used, and by means of the passing of the beam with 1064 nm the laser crystal absorbs a portion, is excited and oscillates. In the state in which an EO-switch 24a functioning as Q-switch is closed the laser crystal 24c is excited by the continuous irradiation with the beam and accumulates energy. When a desired energy has been reached the EO-switch 24a opens, the excitation light from the laser crystal 24c is reflected by a total reflection mirror 24b and a resonance is generated between this mirror and the partial reflection mirror and dichroic mirror 24d. By means of this, a portion of a pulsed laser beam with a wavelength of 1064 nm passes through the partial reflection mirror and dichroic mirror 24d and is placed on top of the continuous-wave beam. The pulsed beam and the continuous-wave beam are directed towards the interior of the light emission tube 1 via an optical means 3. The pulse width and the period of the pulsed laser beam are determined by the opening time of said EO-switch 24a.

An optical means 6 shown in FIG. 12 by dotted lines serves to suppress the chromatic aberration occurring because of the different wavelengths of the pulsed beam and the CW beam. The suppression of the chromatic aberration will be explained later.

Also with the present embodiment the same results as those of the eighth embodiment can be obtained and the formation of the high-temperature plasma state and the maintenance of the high-temperature plasma state can be performed reliably Further, as the power of the continuous-wave laser beam may be small, a heating of the light emission tube and the generation of distortions can be suppressed and the lighting life cycle can be prolonged. Further, the continuous-wave laser oscillator part can be implemented employing a presently practically utilized laser device. And because the pulsed laser oscillator part 22 uses the beam from the continuous-laser oscillator part as the excitation light, the laser oscillator components for the pilot light in the pulsed laser oscillator part shown in the first to sixth embodiments can be omitted and the structure of the whole device can be simplified.

Figure 13:
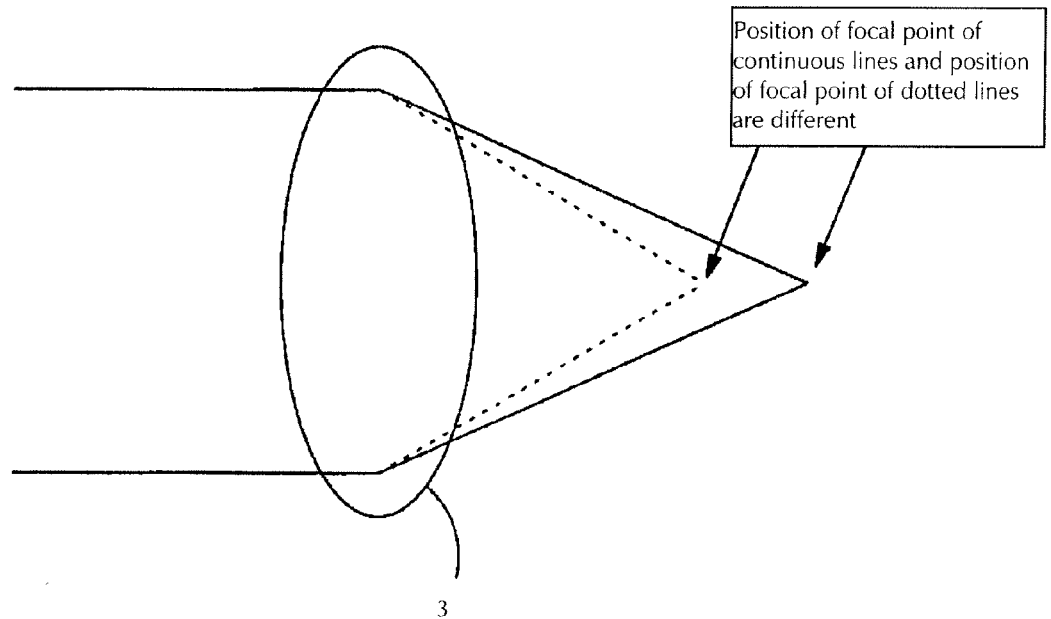
FIG. 13 is a view explaining the chromatic aberration.

As discussed above, for the formation of a high-temperature plasma state in the interior of the light emission tube it is preferred to form energy with a high density, and for this purpose a condensation by a focusing means 3 to focus in the interior of the light emission tube 1 is contemplated. If a convex lens etc. is used for the focusing means 3, the beams are focused at the same position, if the wavelengths of the beams are the same wavelengths, but if the wavelengths of the beams are different wavelengths, the beams are focused at different positions shown by continuous lines and dotted lines in FIG. 13 and a chromatic aberration is generated. If this chromatic aberration is generated, there is the possibility that the high-temperature plasma state cannot be maintained by the continuous beam if the focal point of the continuous-wave beam does not come into the region with the high-temperature plasma state produced by the pulsed beam.

In the following, the means suppressing this chromatic aberration is explained by a tenth and an eleventh embodiment.

The tenth embodiment will be explained using FIG. 14.

Figure 14:
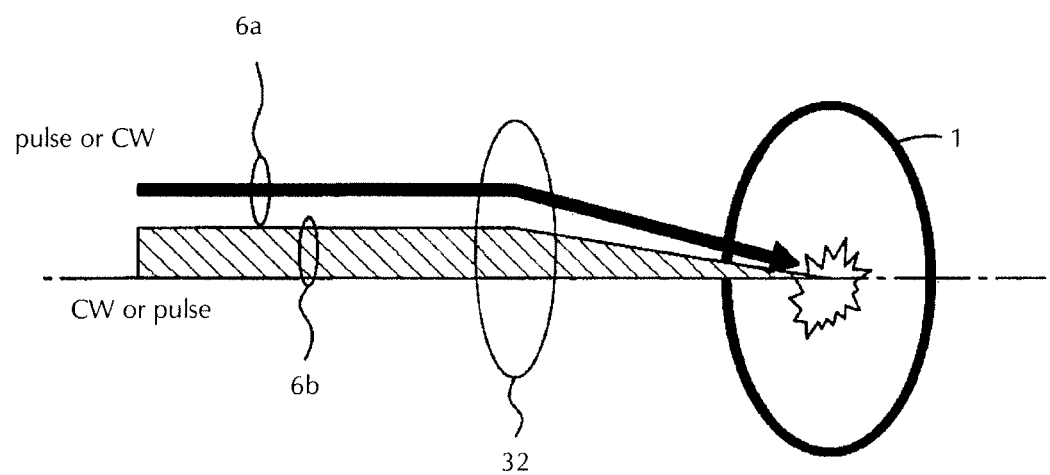
FIG. 14 is a schematical view showing a tenth embodiment of the light source device according to the present invention.

FIG. 14 is a view in which optical means 6a, 6b for the suppression of a chromatic aberration are arranged separately in the second embodiment shown in FIG. 5 in the case of differing wavelengths of the pulsed beam and the continuous-wave beam. The remaining configuration is the same as with the device shown in FIG. 5. In FIG. 14, the optical means 6a, 6b are arranged on the light paths until the superposition of both beams. As to the function and the position of the optical means, any of the following points (1) to (3) can be applied.

Figure 15A:
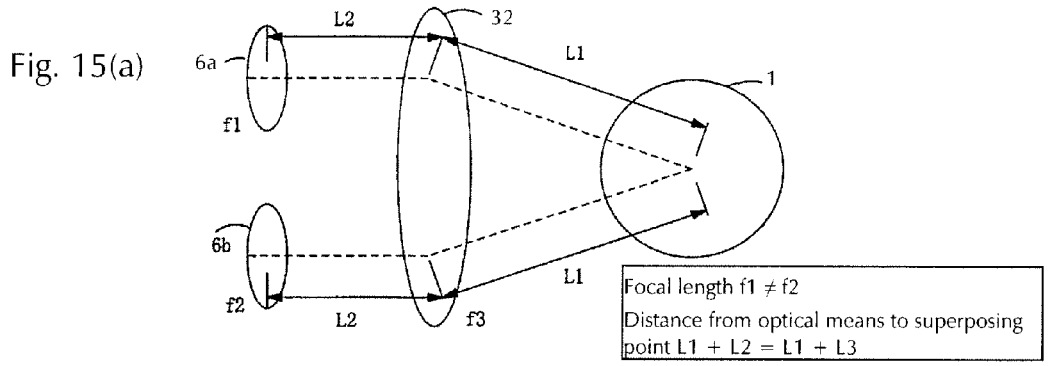
FIG. 15 is a schematical view showing examples for the arrangement of the optical means to suppress the chromatic aberration.

(1) As shown in FIG. 15(a), one optical means 6a is provided on the way of the light path of the pulsed laser beam, the other optical means 6b having a focal length which is different from that of said one optical means is arranged on the way of the light path of the continuous-wave laser oscillator part, and the distance from the one optical means 6a to the superposing point of both beams and the distance from the other optical means 6b to the superposing point of both beams are the same.

Figure 15B:
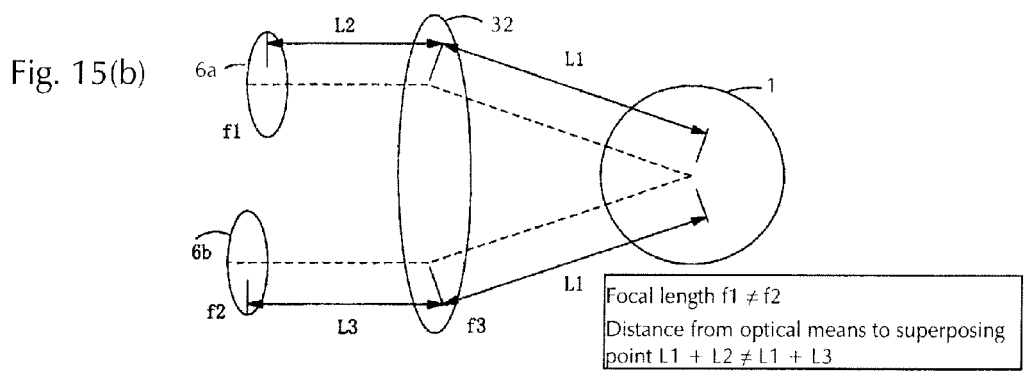

(2) As shown in FIG. 15(b), one optical means 6a is provided on the way of the light path of the pulsed laser oscillator means, the other optical means 6b having a focal length which is different from that of said one optical means 6a is provided on the way of the light path of the continuous-wave laser oscillator part, and the distance from the one optical means 6a to the superposing point of both beams and the distance from the other optical means 6b to the superposing point of both beams are different.

Figure 15C:
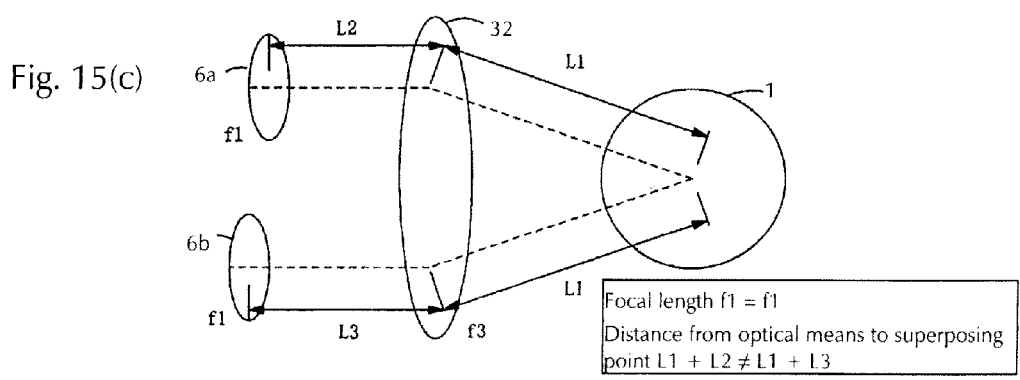

(3) As shown in FIG. 15(c), one optical means 6a is provided on the way of the light path of the pulsed laser oscillator means, the other optical means 6b having the same focal length as said one optical means 6a is provided on the way of the light path of the continuous-wave laser oscillator part, and the distance from the one optical means 6a to the superposing point of both beams and the distance from the other optical means 6b to the superposing point of both beams are different.

By means of providing optical means to eliminate the chromatic aberration of each beam separately on the light path of each beam and configuring such as described in the above mentioned points (1) to (3), the chromatic aberration because of the difference of the wavelengths of each beam can be suppressed and the high-temperature plasma state can be maintained well.

In the case of point (1), the chromatic aberration is suppressed by the difference of the focal lengths f1 and f2 of the optical means.

In the case of point (2), the chromatic aberration is suppressed by the difference of the focal lengths f1 and f2 of the optical means and the distance from each of the optical means to the superposing point.

In the case of point (3), the chromatic aberration is suppressed by the distance from each optical means to the superposing point.

FIG. 15 is a schematic representation. Actually the optical axes of the beams having passed through the optical means 6a and 6b coincide until the entrance in the focusing means such as the convex lens 32.

Figure 16:
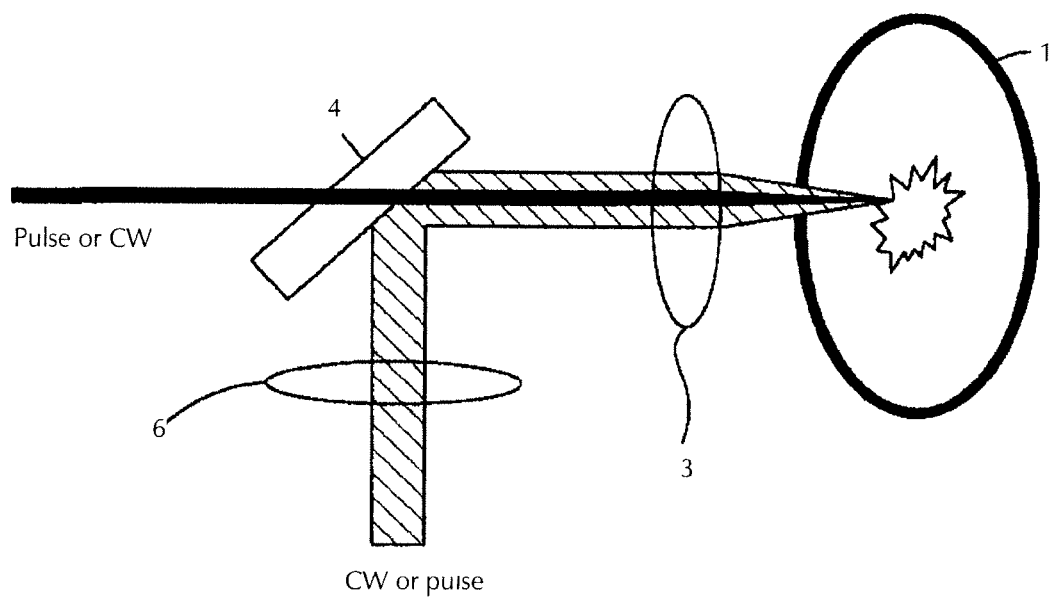
FIG. 16 is a schematical view showing an eleventh embodiment of the light source device according to the present invention.
Figure 18A:
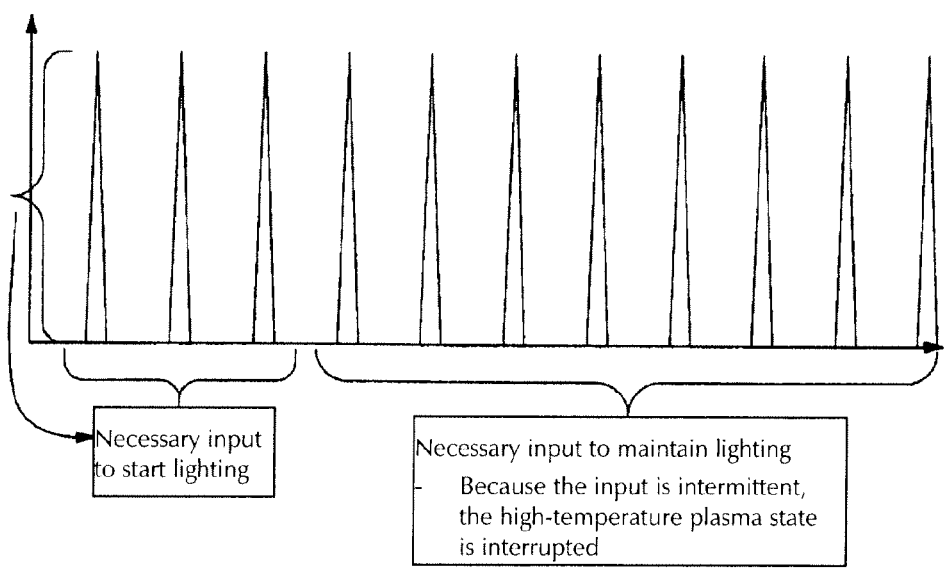
FIG. 18 is a schematical view of a pulsed laser beam and a continuous-wave laser beam.
Figure 18B:
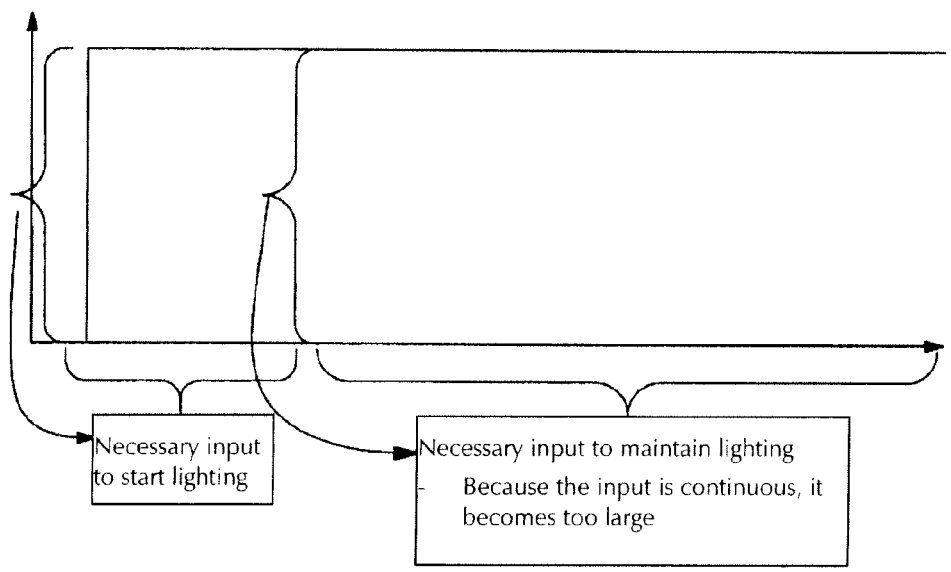

The eleventh embodiment is explained using FIG. 16.

FIG. 16 is a view in which an optical means 6 eliminating the chromatic aberration of the beams is provided on at least one light path to suppress the chromatic aberration in the fifth embodiment shown in FIG. 8 in case of differing wavelengths of the pulsed beam and the continuous-wave beam. The remaining configuration is the same as with the device shown in FIG. 8. The device shown in FIG. 16 is configured such that the light paths of the pulsed beam and the continuous-wave beam are placed on top of each other using a dichroic mirror 4 and are focused by a focusing means 3, and an optical means 6 to suppress the chromatic aberration because of the difference of the wavelengths of the pulsed beam and the continuous-wave beam is arranged at the entrance side of the dichroic mirror 4. Also in the present embodiment the chromatic aberration can be suppressed by suitably selecting the focal length or the position of the optical means 6.

As the problem of the chromatic aberration occurs when beams with different wavelengths are focused by a convex lens or the like being a common focusing means, there is the possibility that this problem occurs in FIG. 5 and FIG. 8 to FIG. 12. Therefore, the technique explained by the embodiments of FIG. 10 and FIG. 11 can be used in FIG. 5 and FIG. 8 to FIG. 12.

In FIG. 8 to FIG. 10 the chromatic aberration can be suppressed by providing the above mentioned optical means until the light paths of the beams are superposing. In FIG. 11, the chromatic aberration can be suppressed by arranging the optical means 6a and/or the optical means 6b at the position shown by dotted lines in the drawing, and in FIG. 12 the suppression of the chromatic aberration is possible by arranging the optical means 6 at the position shown by dotted lines in the drawing. Here, a convex lens is shown as the optical means suppressing the chromatic aberration, but as long as the focal length can be varied, also other optical components can be used. It is possible, for example, to use a concave lens or a DOE.

The above mentioned chromatic aberration occurs when the wavelengths of the pulsed laser beam and the continuous-wave laser beam are different, but if the difference of the wavelengths is small, it is not necessary by all means to provide a means suppressing the chromatic aberration. As will be explained in the following, it is desirable to provide a means correcting the chromatic aberration, if the wavelengths in general differ such that one wavelength has at least twice the value of the other one.

For example, the difference in the focal point with fused quartz glass in case of a focal length of f=100 mm becomes as follows according to the wavelengths. In case of a wavelength of the continuous-wave laser beam of 1064 nm, the position of the focal point is at 114.5 mm, and in case of a wavelength of the pulsed laser beam of 532 nm, the position of the focal point is at 111.8 mm. Thus, the difference of the focal points of both beams is 2.7 mm. The region of the high-temperature plasma is extremely small, and it is a region with a diameter of, for example 0.5 mm. If the focal points are separated by 2.7 mm as mentioned above, the energy to excite the high-temperature plasma cannot be supplied and a steady lighting cannot be performed. Especially the high-temperature plasma by means of the pulsed laser is easily generated ahead of the focal point because of the large pulse energy, and the position shifts further to the forward side. Therefore, in case the wavelengths differ such that one wavelength has at least twice the value of the other one such as mentioned above, a focusing means correcting the chromatic aberration becomes necessary. The difference of the focal points changes according to the material of the optical means, and further there are also cases in which also the region of the high-temperature plasma state extends beyond 0.5 mm because of the applied energy. Above, merely an example has been shown, but there is no limitation to this example.

By the way, to form a high-temperature plasma-state in the interior of the light emission tube 1 as mentioned above, it is preferred to form a region with an energy state having a high density, and to this end it is contemplated to focus by the focusing means 3 such that the focal point is located in the interior of the light emission tube 1. But because a high-temperature plasma state is formed when the energy density of the laser beam exceeds the threshold value ionizing the light emitting means, the position at which the high-temperature plasma state is formed is not limited to the focal point of the laser beam. That means, when the energy of the laser beam is high, the energy density exceeds the threshold value before reaching the focal point, and in this case the plasma state is formed ahead of the focal point.

The case in which the power of the pulsed beam is larger than the power of the continuous-wave beam and the high-temperature plasma state is formed by the pulsed beam ahead of the focusing point will be explained by means of FIG. 17.

When, as is shown in FIG. 17(a), a convex lens or the like is used as the focusing means 3, the beams are focused at the same position if the wavelength of each beam is the same. When the power of the pulsed beam is large, the energy density becomes high in the course of the focusing by the focusing means 3 and the high-temperature plasma state starts to form, as is shown in FIG. 17(a). But while approximating the focal point, the power of the pulsed beam is used for the formation of the high-temperature plasma, and at the time the focal point is reached, this power has almost disappeared. That means, the position at which the high-temperature plasma state A is formed by the pulsed beam is located ahead of the focal point, as is shown in this drawing. Because, on the other hand, the power of the continuous-wave beam is small, the energy density to maintain the high-temperature plasma state is formed by focusing by means of the focusing means 3 at the focal point (B in the drawing). Thus, as shown in FIG. 17(a), the region A in which the pulsed beam forms the high-temperature plasma state (region with a high-energy state) and the region B in which the continuous-wave beam maintains the high-temperature plasma state (region with a high-energy state) are different and there may be cases in which the high-temperature plasma state cannot be maintained by the continuous-wave beam.

The optical means 6 explained as a measure to suppress the chromatic aberration can be used as a position regulating means regulating the positions of these two regions. The optical means 6 is, for example, provided on at least one light path, as is shown in FIG. 16. When the optical means 6 is arranged in this way, as to the beams radiating into the light emission tube 1, the continuous-wave beam is focused by the optical means 6, enters the focusing means 3 and is focused further. By means of this, the region B' of the maintenance of the high-temperature plasma state by the continuous-wave beam is focused at the region A' at which the pulsed beam forms the high-temperature plasma state, both regions coincide and the high-temperature plasma-state can be maintained. That means, as shown in FIG. 17(c), the region in which the energy density of the pulsed beam (shown by a continuous line in this drawing) exceeds the threshold value for forming the high-temperature plasma state (shown by a dotted line in the drawing) and the region in which the energy density of the continuous-wave beam (shown by a broken line in the drawing) exceeds the threshold value for forming the high-temperature plasma (shown by a double-dotted line in the drawing) coincide and the high-temperature plasma state can be maintained reliably.

Above, a case in which beams having the same wavelength are focused by the same focusing means has been explained, but in case of different wavelengths the problem of the chromatic aberration and the problem that the region forming the high-temperature plasma state and the region maintaining the high-temperature plasma state are different are combined and the problem of the impossibility to maintain the high-temperature plasma state may arise. The means for solution mentioned above acts effectively also when beams having different wavelengths are focused by the same optical means.

What is claimed is:

1. A light source device, comprising a hollow light emission tube, in which mercury or a light-emitting gas is enclosed as a light emitting means, and a pulsed laser oscillator part emitting a pulsed laser beam towards said light emission tube, wherein a continuous-wave laser oscillator part is provided emitting a continuous-wave laser beam towards said light emission tube,
wherein the continuous-wave laser oscillator part is adapted to produce the continuous-wave laser beam with an intensity that is smaller than an intensity of the pulsed laser beam that the pulsed laser oscillator part is adapted to produce, and
wherein the light source device is adapted to emit both the continuous-wave laser beam and the pulsed laser beam are emitted towards said light emission tube when lighting is initiated, and is adapted to stop the emission of the pulsed laser beam towards said light emission tube after the lighting has been started so that only the continuous-wave laser beam is emitted towards said light emission tube to maintain lighting.

2. The light source device according to claim 1, wherein a light path of the beam from said pulsed laser oscillator part and a light path of the beam from said continuous-wave laser oscillator part are superposed at least in a region of said light emission tube.

3. The light source device according to claim 1, wherein said continuous-wave laser oscillator part is adapted to emit a portion of the continuous-wave laser beam to said pulsed laser oscillator part as excitation light in order to excite a laser crystal in said pulsed laser oscillator part so as to emit a pulsed laser beam, wherein said pulsed laser oscillating part comprises a Q-switch, the opening time of said Q-switch defining the pulse width and the period of said pulsed laser beam.

4. The light source device according to claim 2, wherein said continuous-wave laser oscillator part is adapted to emit a portion of the continuous-wave laser beam to said pulsed laser oscillator part as excitation light in order to excite a laser crystal in said pulsed laser oscillator part so as to emit a pulsed laser beam.

5. The light source device according to claim 1, wherein a focusing means is provided on a way of a pulsed laser beam light path and a continuous-wave laser beam light path so as to focus the pulsed laser beam and the continuous-wave laser beam in the light emission tube, and an optical means is provided on the way of at least one of the light paths of said laser beams such that a high-energy state region formed by the pulsed laser beam and a high-energy state region formed by the continuous-wave laser beam are placed on top of each other in the light emission tube.

6. The light source device according to claim 2, wherein a focusing means is provided on a way of a pulsed laser beam light path and a continuous-wave laser beam light path so as to focus the pulsed laser beam and the continuous-wave laser beam in the light emission tube, and an optical means is provided on the way of at least one of the light paths of said laser beams such that a high-energy state region formed by the pulsed laser beam and a high-energy state region formed by the continuous-wave laser beam are placed on top of each other in the light emission tube.

7. The light source device according to claim 3, wherein a focusing means is provided on a way of a pulsed laser beam light path and a continuous-wave laser beam light path so as to focus the pulsed laser beam and the continuous-wave laser beam in the light emission tube, and an optical means is provided on the way of at least one of the light paths of said laser beams such that a high-energy state region formed by the pulsed laser beam and a high-energy state region formed by the continuous-wave laser beam are placed on top of each other in the light emission tube.

8. The light source device according to claim 1, wherein the light emission tube is surrounded by a mirror having an ellipsoid of revolution-shaped reflection surface.

* * * * *